(12) United States Patent
Winters

(10) Patent No.: US 6,190,964 B1
(45) Date of Patent: Feb. 20, 2001

(54) METHOD OF PRODUCING A STACKED CAPACITOR

(75) Inventor: Reiner Winters, München (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/356,402

(22) Filed: Jul. 16, 1999

(30) Foreign Application Priority Data

Jul. 16, 1998 (DE) .............................................. 198 32 095

(51) Int. Cl.⁷ ........................ H01L 21/8242; H01L 21/20
(52) U.S. Cl. ........................ 438/254; 438/253; 438/398; 438/397; 257/306
(58) Field of Search .................................. 438/253, 254, 438/396, 397; 257/306

(56) References Cited

U.S. PATENT DOCUMENTS

| 4,685,197 | 8/1987 | Tigelaar et al. |
|---|---|---|
| 4,700,457 | * 10/1987 | Matsukawa ............................. 437/52 |
| 5,021,920 | 6/1991 | Smith . |
| 5,077,225 | * 12/1991 | Lee ......................................... 437/24 |
| 5,153,813 | * 10/1992 | Oehrlein et al. ..................... 361/313 |

FOREIGN PATENT DOCUMENTS 0 539 681 A1  5/1993 (EP) .

OTHER PUBLICATIONS

"Method Of Fabricating A New Multi-Layer Stacked Memory Cell Structure" IBM Technical Disclosure Bulletin vol. 33. No. 2, Jul. 1990 pp. 161–163.

Japanese Patent Abstract No. 62166559 (Manabu), dated Jul. 23, 1987.

W. Heywang et al. (ed.) : Halbleiter–Elektronik (semiconductor–electronics), vol. 19, pp. 271–293.

* cited by examiner

Primary Examiner—John F. Niebling
Assistant Examiner—Jennifer M. Kennedy
(74) Attorney, Agent, or Firm—Herbert L. Lerner; Laurence A. Greenberg; Werner H. Stemer

(57) ABSTRACT

The fabrication method results in a stacked capacitor, in particular for use in a semiconductor memory device. The stacked capacitor has a semiconductor substrate of a first conductivity type and a well of a second conductivity type formed in the substrate. A stack of alternating first conductive layers of the first conductivity type and second conductive layers of the second conductivity type, with the interposition of respective insulation layers are formed on the semiconductor substrate. Two neighboring insulation layers are connected to one another on a first side of the stack by insulation bridges in such a way as to provide continuous insulation of the second conductive layers toward the first side. A first spacer, which is provided on the first side of the stack, forms a first capacitor connection and is preferably connected to the semiconductor substrate and to the first conductive layers. A second spacer, which is provided on the second side of the stack, forms a second capacitor connection connected to the well and to the second conductive layers.

14 Claims, 9 Drawing Sheets

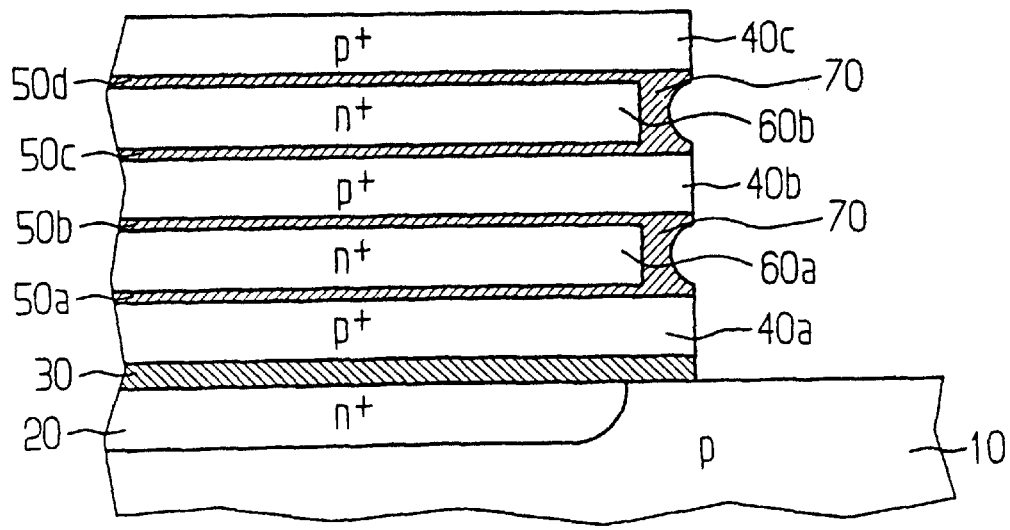
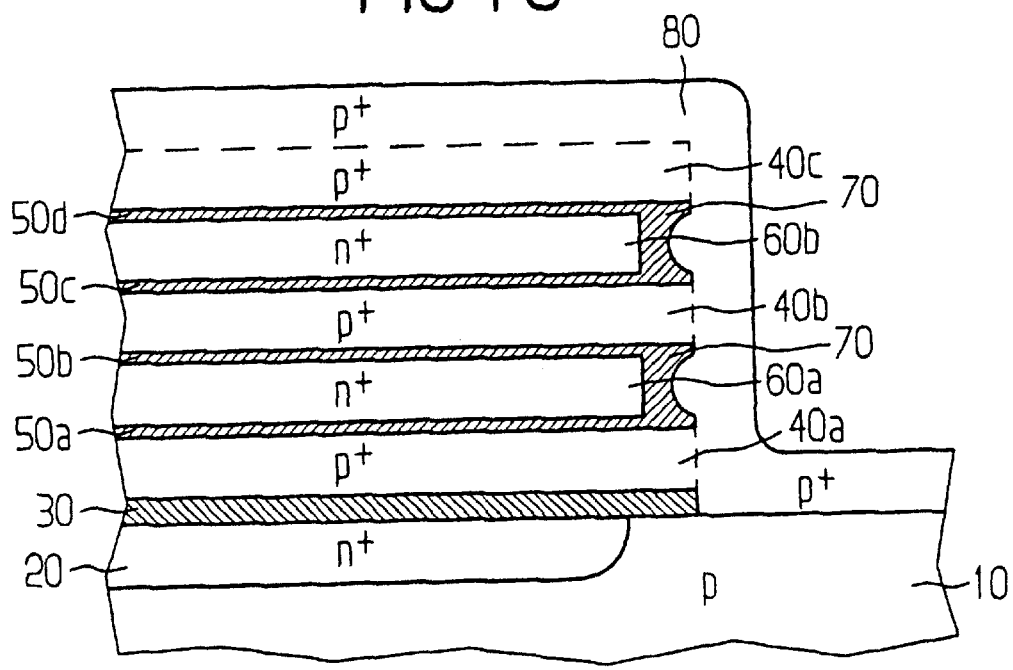

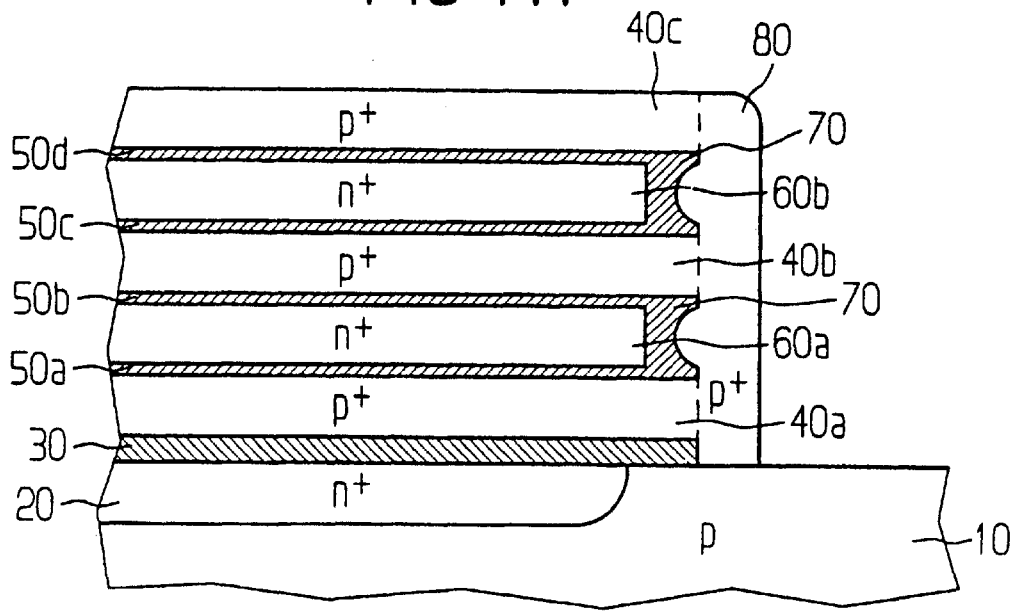
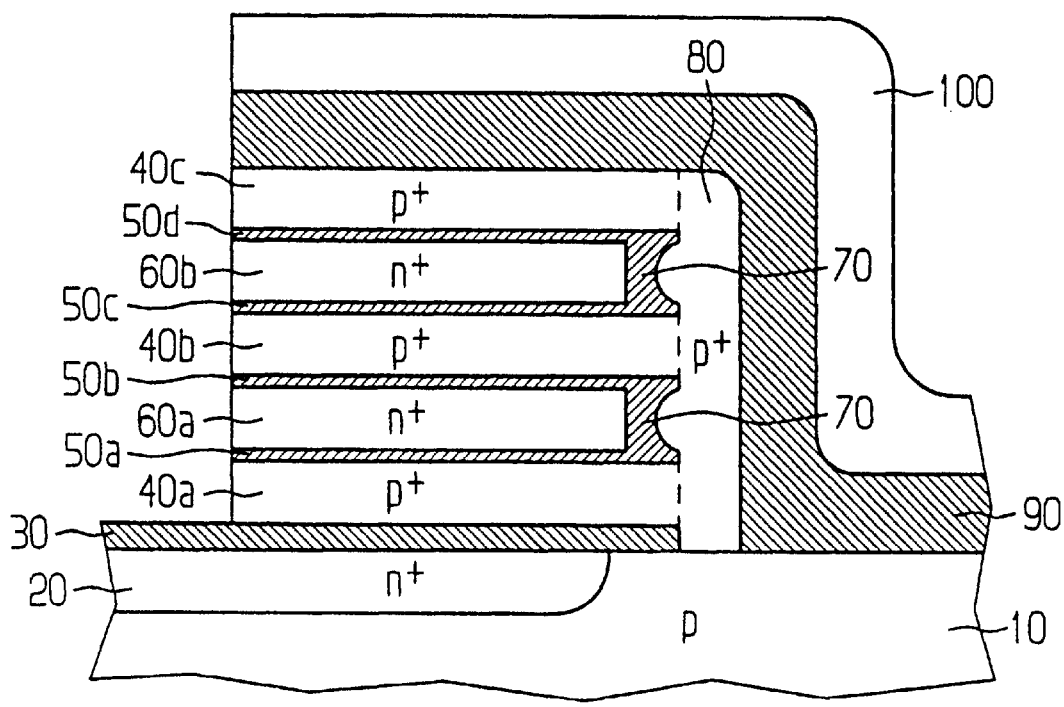

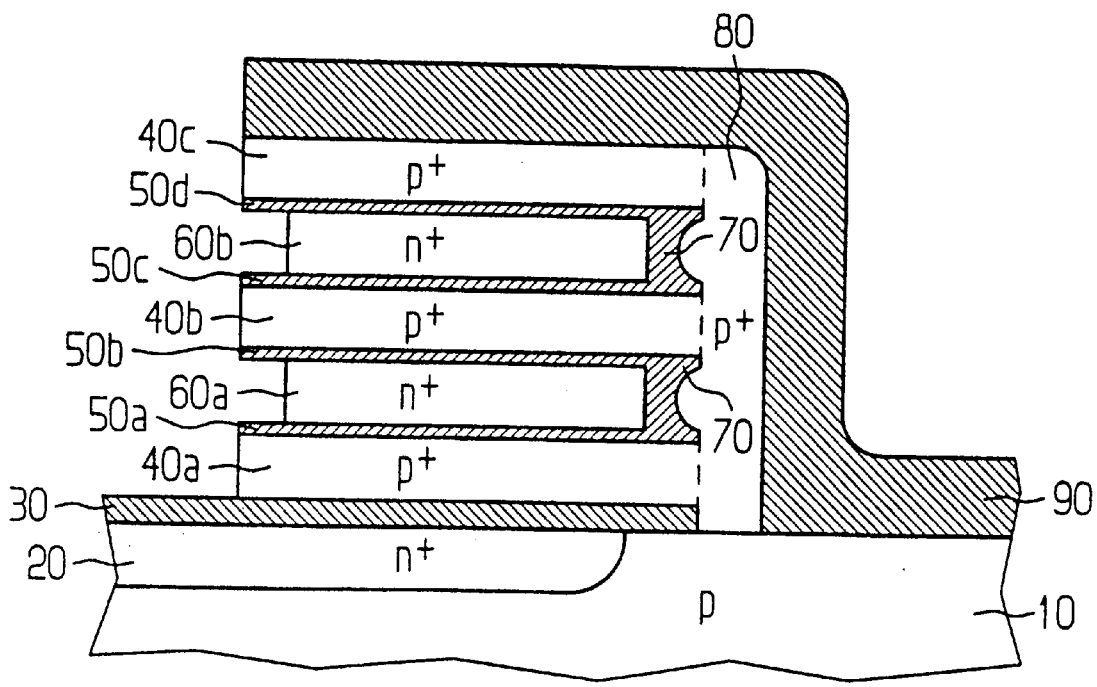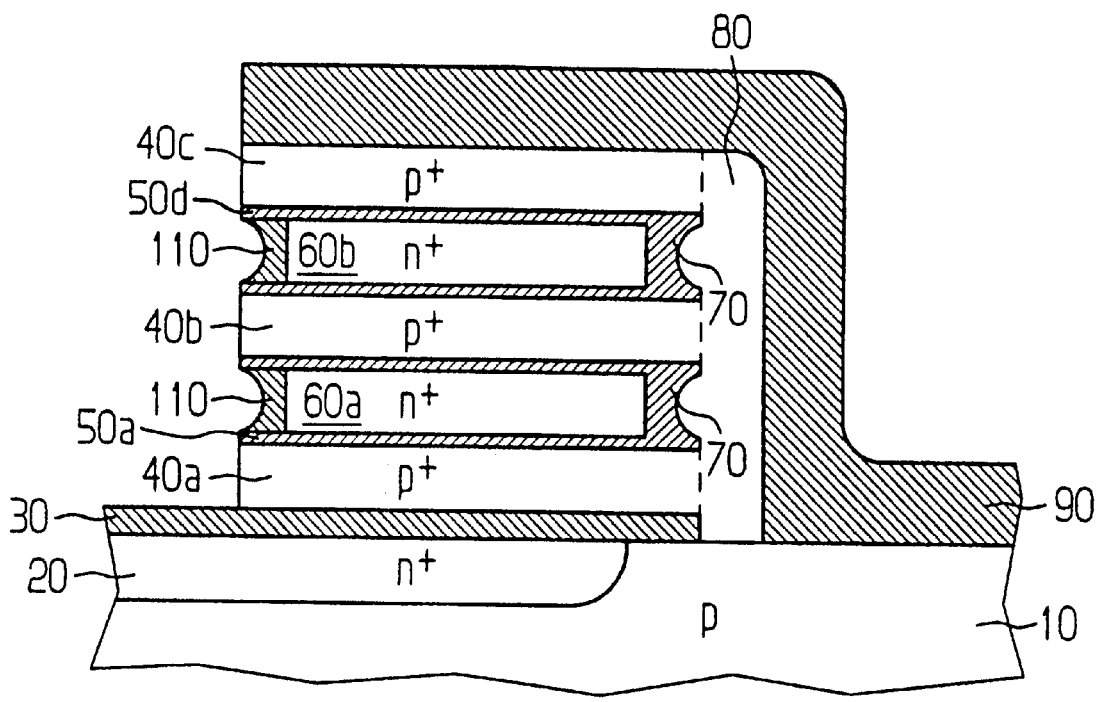

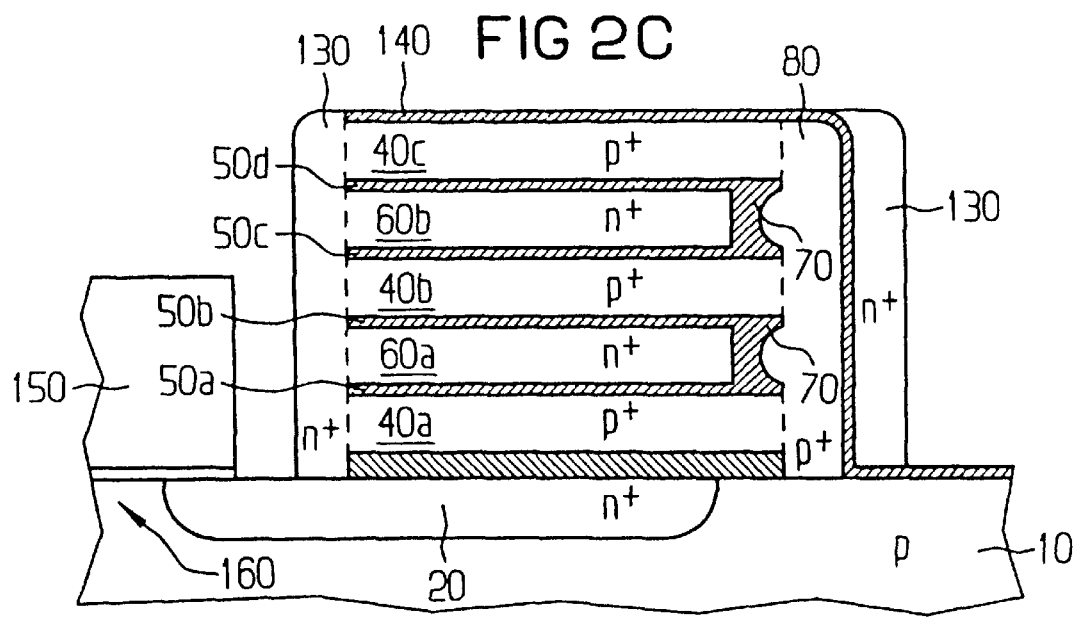
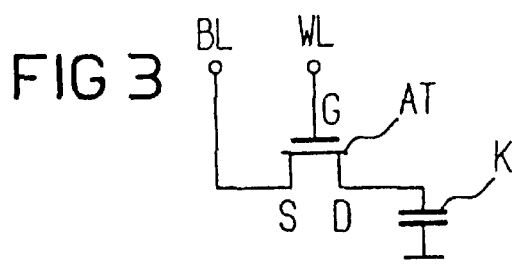
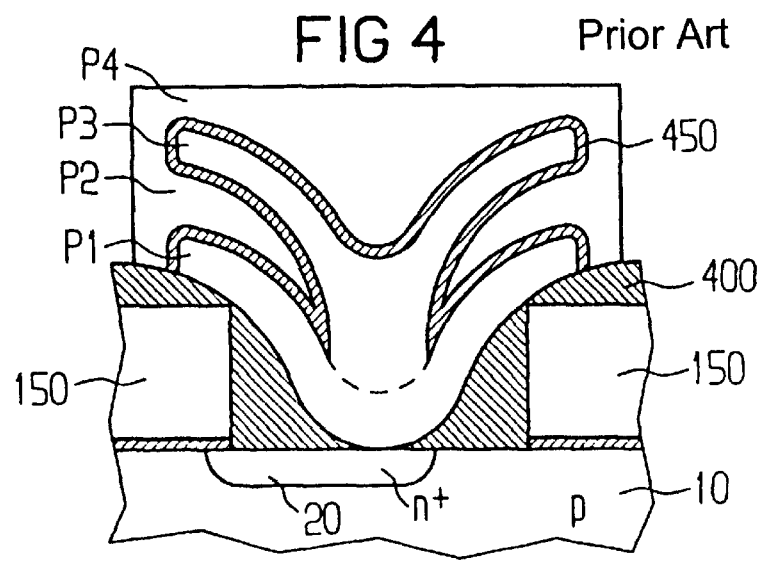

METHOD OF PRODUCING A STACKED CAPACITOR

BACKGROUND OF THE INVENTION

Field of the Invention

The present invention pertains to a fabrication method for producing a stacked capacitor.

Although applicable to any desired stacked capacitors, the present invention and also the problems on which it is based will be described and explained herein with regard to a stacked capacitor for use in a semiconductor memory device, for instance a DRAM (dynamic read/write random access memory).

Integrated circuits (ICs) or chips use capacitors for the purpose of storing charge. One example of an IC which uses capacitors for storing charges is a memory IC, such as for instance a chip for a dynamic random access memory (DRAM). The charge state ("0" or "1") in the capacitor thereby represents a data bit.

A DRAM chip contains a matrix of memory cells connected up in the form of rows and columns. The row connections are usually designated as word lines and the column connections as bit lines. Data are read from the memory cells or data are written to the memory cells by the activation of suitable word lines and bit lines.

A DRAM memory cell usually contains a selection transistor connected to a capacitor. The transistor contains two diffusion regions separated by a channel, above which a gate is disposed. Depending on the direction in which the current flows, one diffusion region is designated as the drain and the other as the source. The designations "drain" and "source" are in this case used mutually interchangeably with regard to the diffusion regions. The gates are connected to a word line, and one of the diffusion regions is connected to a bit line. The other diffusion region is connected to the capacitor. The application of a suitable voltage to the gate switches the selection transistor on, enables current to flow between the diffusion regions through the channel in order, in this way, to form a connection between the capacitor and the bit line. The switch-off of the selection transistor disconnects this connection by interrupting the flow of current through the channel.

The charge stored in the capacitor decreases with time on account of an inherent leakage current. Before the charge has decreased to an undetermined level (below a threshold value), the storage capacitor must be refreshed.

The continual striving to reduce the size of memory devices demands that DRAMs be designed with a greater density and a smaller characteristic size, that is to say a smaller memory cell area. In order to fabricate memory cells that occupy a smaller surface region, components having a smaller base area are required.

A reduction in the base area of a capacitor generally leads to a smaller capacitance, which has to be compensated for by the construction of the capacitor. This is because an excessively small capacitance of the storage capacitor can adversely affect the functionality and usability of the memory device. In particular, the amplitude of the output signal and the refresh rate of a memory cell depend on the magnitude of the capacitance.

With reference to FIG. 3, there is shown a schematic of the equivalent circuit diagram for a stacked capacitor for use in a semiconductor memory device. The designation BL thereby refers to a bit line, WL to a word line, AT to a selection transistor and D, S, G to drain, source, gate, respectively, of the selection transistor AT. The designation K refers to the capacitor per se.

There are three kinds of integrated capacitors: planar capacitors, trench capacitors, and stacked capacitors. Planar capacitors are the general standard; trench and stacked capacitors are used particularly in megabit DRAMs because trench capacitors and stacked capacitors have a larger capacitance than planar capacitors given the same base area.

A higher capacitance is achieved by the trench capacitor and stacked capacitor having a three-dimensional structure whose surface area is significantly greater than its base area. The fabrication of this three-dimensional structure generally requires an additional fabrication outlay.

The trench capacitor makes use of the fact that the wall area of a trench etched deeply into the base material is much larger than its base area.

In particular, a distinction is made between trench capacitors with a polysilicon plate and trench capacitors with a buried plate.

A stacked capacitor comprises, in principle, a plurality of planar capacitors which are arranged one above the other and whose electrodes are connected in parallel. Examples of known stack capacitors are a crown stacked capacitor and a rough silicon stacked capacitor.

Further details on trench and stacked capacitors may be found for example in Widmann, Mader, Friedrich: "Technologie hochintegrierter Schaltungen" [Technology of Large Scale Integrated Circuits], 2d ed., Berlin, 1996, pages 273, 292f.

In these customary trench and stack designs, a reduction of the capacitor base area can generally be achieved only by means of a higher lateral resolution in the photolithography. The depth of the trenches or the edge length of the stacks is limited by the trench etching technology.

With reference to FIG. 4, there is shown a diagrammatic view of a prior art stacked capacitor for use in a semiconductor memory device.

In FIG. 4, P1–P4 designates polysilicon layers, 10 designates a silicon semiconductor substrate, 20 designates an n$^+$-type well, 150 designates gate structures, 400 designates an oxide layer and 450 designates ONO layers (ONO=oxide/nitride/oxide).

FIG. 4 shows the so-called fin cell which is used in particular in a 16-MB DRAM application. As many polysilicon layers P1–P4 as desired can be stacked one on top of the other. The fabrication of such a capacitor with 2n layers requires 2n–1 photoplanes and process control with n–1 sacrificial layers. The process control is therefore quite complicated.

SUMMARY OF THE INVENTION

It is accordingly an object of the invention to provide a stacked capacitor and a corresponding production process, which overcome the above-mentioned disadvantages of the heretofore-known devices and methods of this general type and which enables the integration of large capacitances on a small silicon base area in a simple manner without a high outlay in terms of process engineering.

With the foregoing and other objects in view there is provided, in accordance with the invention, a method of fabricating a stacked capacitor, which comprises the following steps:

providing a semiconductor substrate of a first conductivity type and a well of a second conductivity type formed in the substrate;

forming a stack of alternating first conductive layers of the first conductivity type and second conductive layers of the second conductivity type, with respective insulation layers interposed therebetween, on the semiconductor substrate;

selectively etching the second conductive layers at a first edge region of the stack and undercutting the second conductive layers with respect to the first conductive layers to form undercuts;

forming insulation bridges at the undercuts to provide continuous insulation of the second conductive layers towards the first edge region;

forming a first spacer of a conductive material at the first edge region of the stack, and connecting the first spacer to the semiconductor substrate and to the first conductive layers; and forming a second spacer of a conductive material at a second edge region of the stack, and connecting the second spacer to the well and to the second conductive layers.

In accordance with an added feature of the invention, the method includes the following further steps which are performed prior to the step of forming the spacer:

selectively etching the second conductive layers at the second edge region of the stack, to undercut the second conductive layers with respect to the first conductive layers and forming undercuts;

forming an etching stop layer at the undercuts;

etching the first conductive layers at the second edge region of the stack, to undercut with respect to the second conductive layers and forming second undercuts;

removing the etching stop layer;

forming insulation bridges at the second undercuts for providing continuous insulation of the first conductive layers towards the second edge region.

In accordance with an additional feature of the invention, the first conductive layers of the first conductivity type are $p^+$-doped polysilicon layers and the second conductive layers of the second conductivity type are $n^+$-doped polysilicon layers.

In accordance with another feature of the invention, the selective etching step comprises etching with KOH or chlorine, and thereby only etching the $n^+$-doped polysilicon layers.

In accordance with a further feature of the invention, the process is limited to two photolithography steps, including a first step for forming the first edge region of the stack and a second step forming the second edge region of the stack.

In accordance with again an added feature of the invention, the first spacer is formed by the deposition of polysilicon of the first conductivity type and subsequent self-aligned anisotropic etching.

In accordance with again an additional feature of the invention, the second spacer is formed by the deposition of polysilicon of the second conductivity type and subsequent anisotropic etching.

In accordance with again a further feature of the invention, the semiconductor substrate is a Si substrate, and wherein the insulation layers and the insulation bridges are formed from silicon dioxide or silicon dioxide/silicon nitride/silicon dioxide.

In accordance with a concomitant feature of the invention, the $p^+$-doped polysilicon layers are formed as the first conductive layers of the first conductivity type and the $n^+$-doped polysilicon layers are formed as the second conductive layers of the second conductivity type.

The stacked capacitor according to the invention and the fabrication method have the following advantages over the known solution approaches: there are only two lithography steps for any desired number of layers, namely a respective step for configuring the left-hand and right-hand edge of the stack. All the insulations and connections are self-aligning. Neither deep trenches nor undercuts are necessary. It is possible to employ non-critical standard individual processes. The minimum edge length of the capacitor stack is approximately five times the layer thickness of a polysilicon layer. Furthermore, planarization is not necessary.

This means that the production outlay is low in comparison with other customary methods, to be precise principally when the ratio of capacitance to base area of the capacitor must be large. The alignment of the photomasks is non-critical. The capacitor is shrinkable or scalable.

Overall, the present invention creates a novel process sequence and associated topography of the stacked capacitor produced.

The idea on which the present invention is based consists in firstly producing the complete layer sequence of the stacked capacitor and then patterning it. The electrical connections of the layers are produced in a self-aligning manner during the patterning. In terms of process engineering, use is made of the fact that n-doped silicon can be etched selectively with respect to p-doped silicon using KOH or chlorine. As a result of this and as a result of alternate doping in the layer sequence, it is possible to connect the polysilicon layers alternately to the left-hand and to the right-hand capacitor connection without additional lithography steps. Spacer processes known per se are used for the insulation in the region of the connections. The planar configuration of the capacitor according to the invention and also the positioning of its electrical connections can be configured in diverse ways.

In accordance with one preferred development, the insulation of the first conductive layers toward the second side is realized by the diode structure formed with the second spacer. In this case, during operation, it is necessary to take account of the breakdown voltage of the polysilicon diode operated in the reverse direction.

In accordance with a further preferred development, in each case two neighboring insulation layers are connected to one another alternately on one and the other side of the stack by insulation bridges in such a way as to provide continuous insulation between the first and second conductive layers. This structure is insensitive to the polarity of the capacitor voltage chosen.

In accordance with a further preferred development, the first conductive layers of the first conductivity type are $p^+$-doped polysilicon layers and the second conductive layers of the second conductive type are $n^+$-doped polysilicon layers. These layers can easily be deposited and selectively patterned by means of standard technologies.

In accordance with a further preferred development, the well is the drain region of an associated selection transistor. This creates a simple coupling to the selection transistor.

Other features which are considered as characteristic for the invention are set forth in the appended claims.

Although the invention is illustrated and described herein as embodied in a stacked capacitor and corresponding fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2A to 2C illustrate the essential method steps of a second embodiment of the method for fabricating the stacked capacitor according to the invention, continuing from the production stage shown in FIG. 1H of the first embodiment;

FIG. 3 is a schematic of an equivalent circuit diagram for a stacked capacitor for use in a semiconductor memory device; and FIG. 4 is a diagrammatic view of a prior art stacked capacitor for use in a semiconductor memory device.

Identical reference symbols designate identical or functionally identical elements throughout the figures.

DESCRIPTION OF THE PREFERRED EMBODIMENTS

Figure 1A:
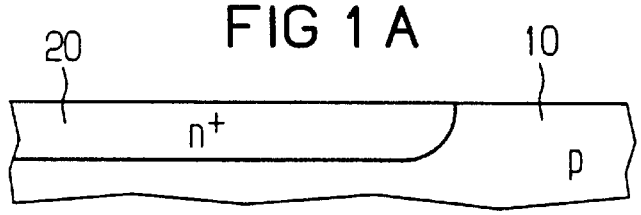
FIGS. 1A to 1O are diagrammatic elevational views showing the essential method steps of a first embodiment of the method for fabricating the stacked capacitor according to the invention.
Figure 1B:
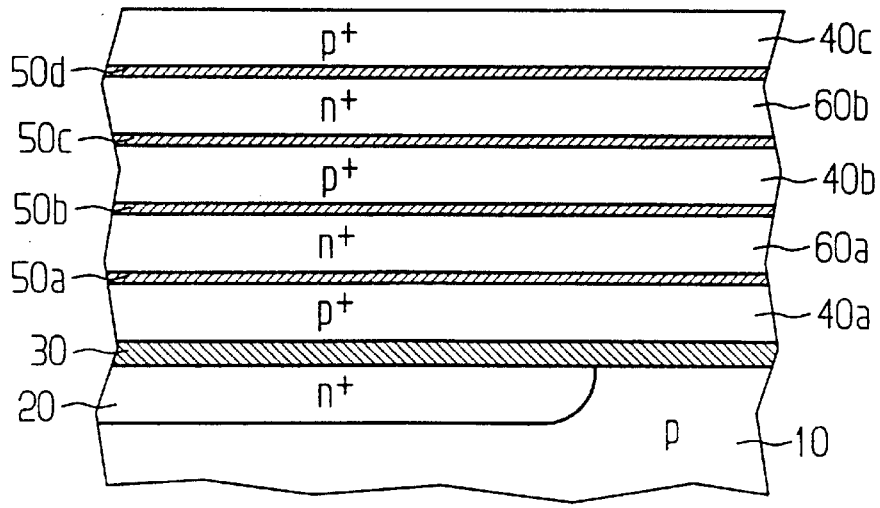
Figure 1C:
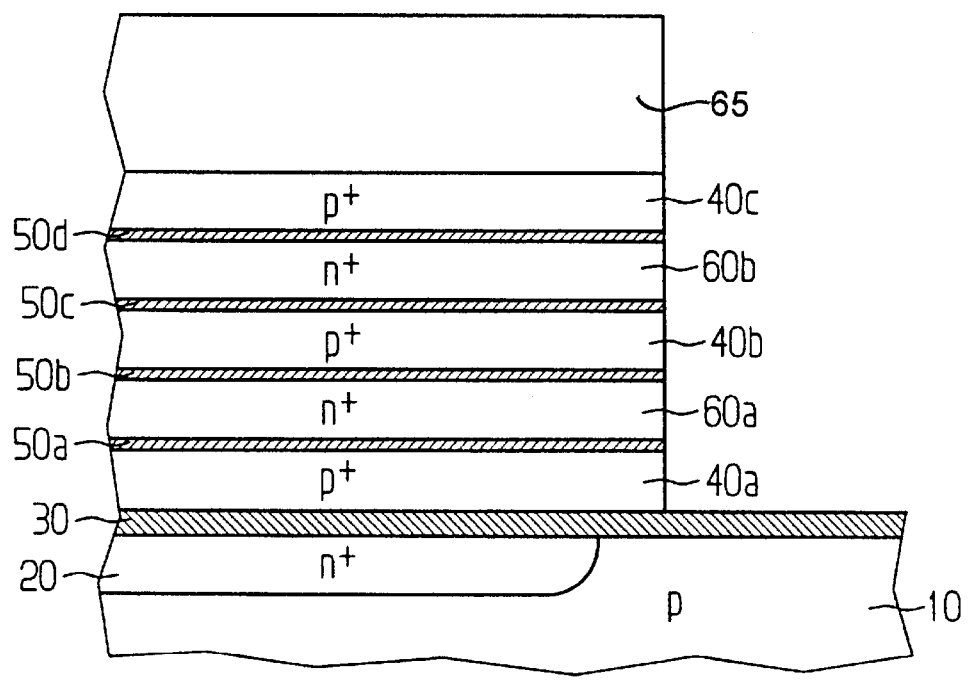
Figure 1D:
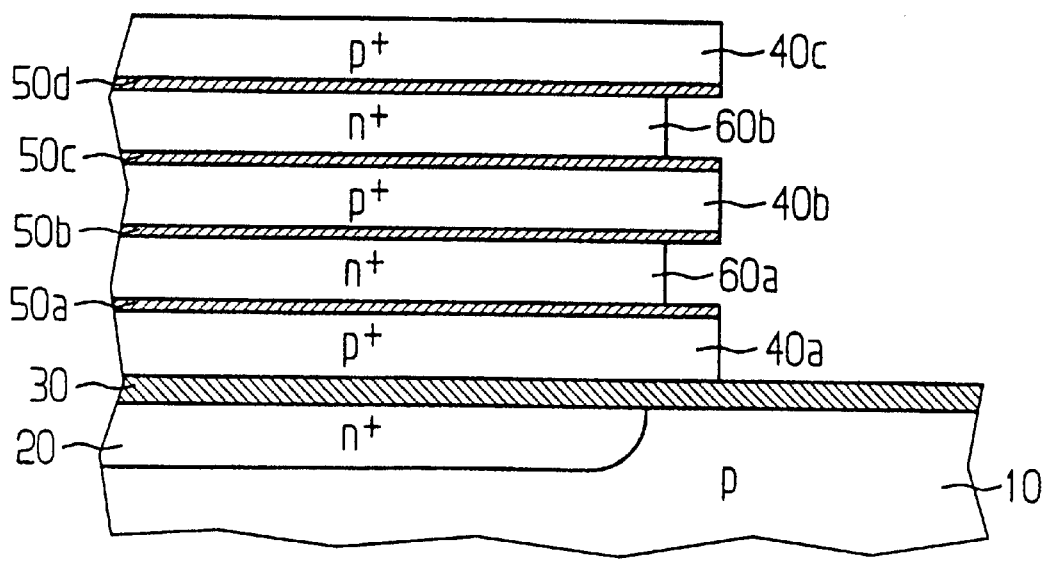
Figure 1E:
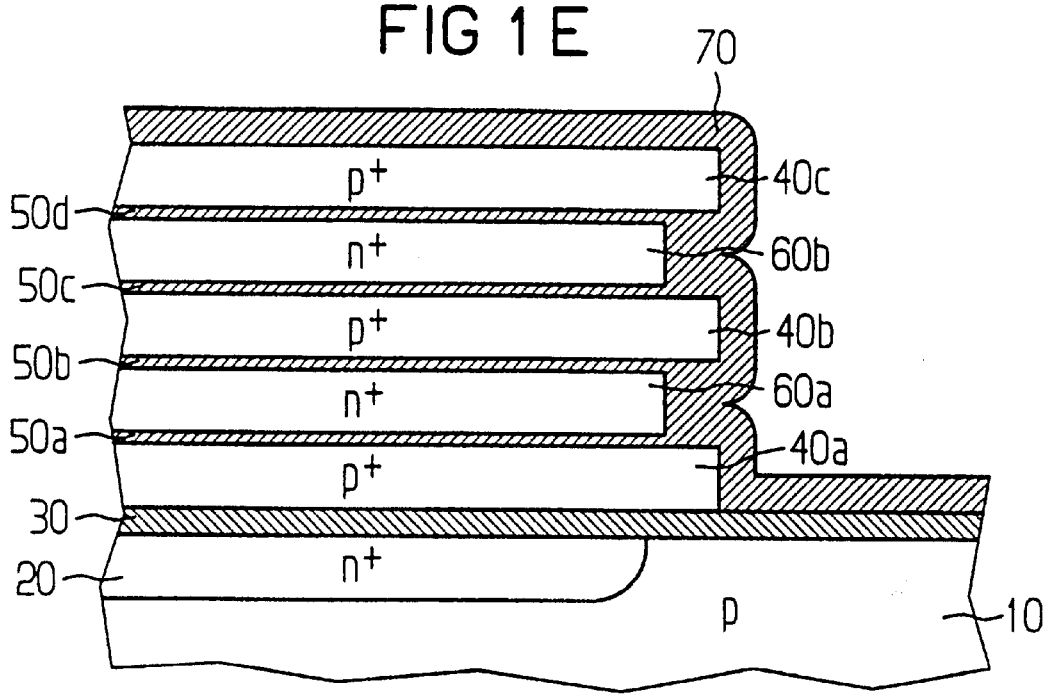
Figure 1:
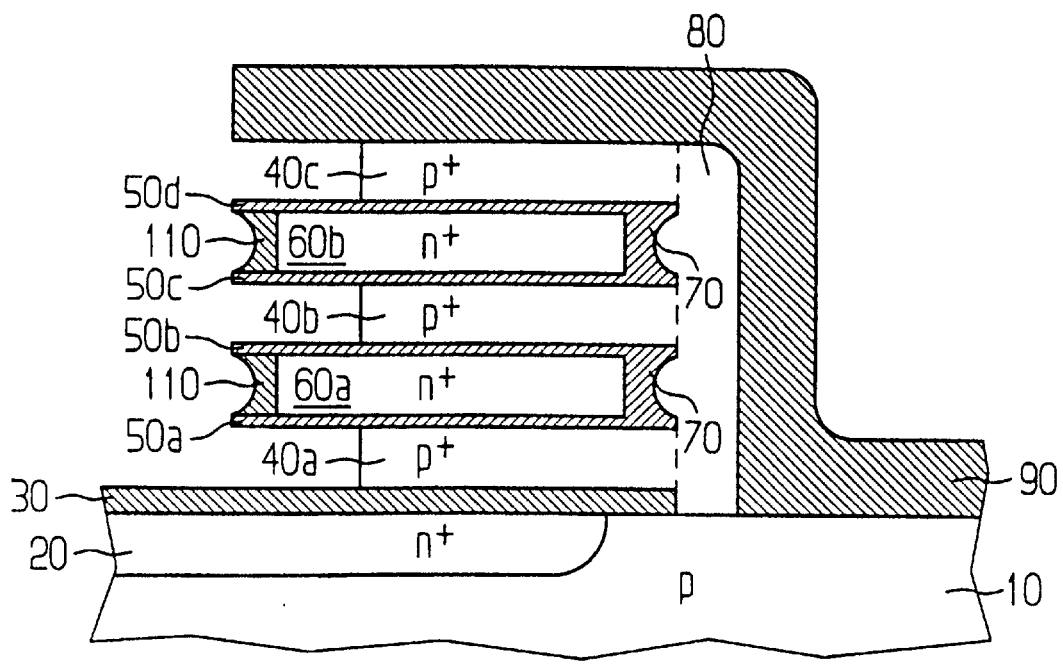
Figure 1:
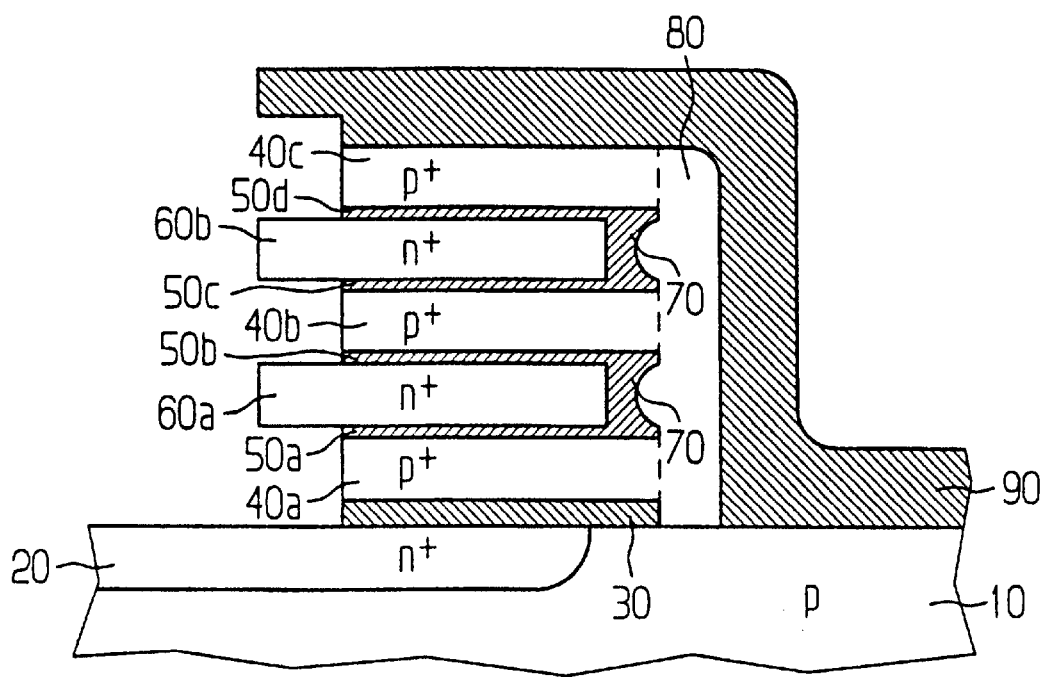
Figure 1N:
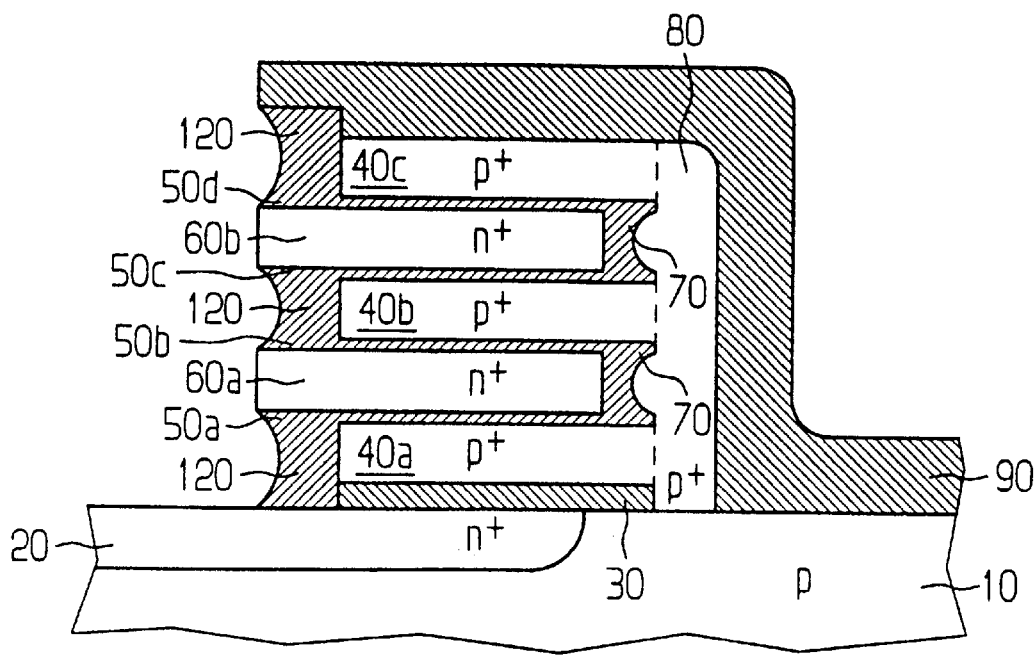
Figure 1O:
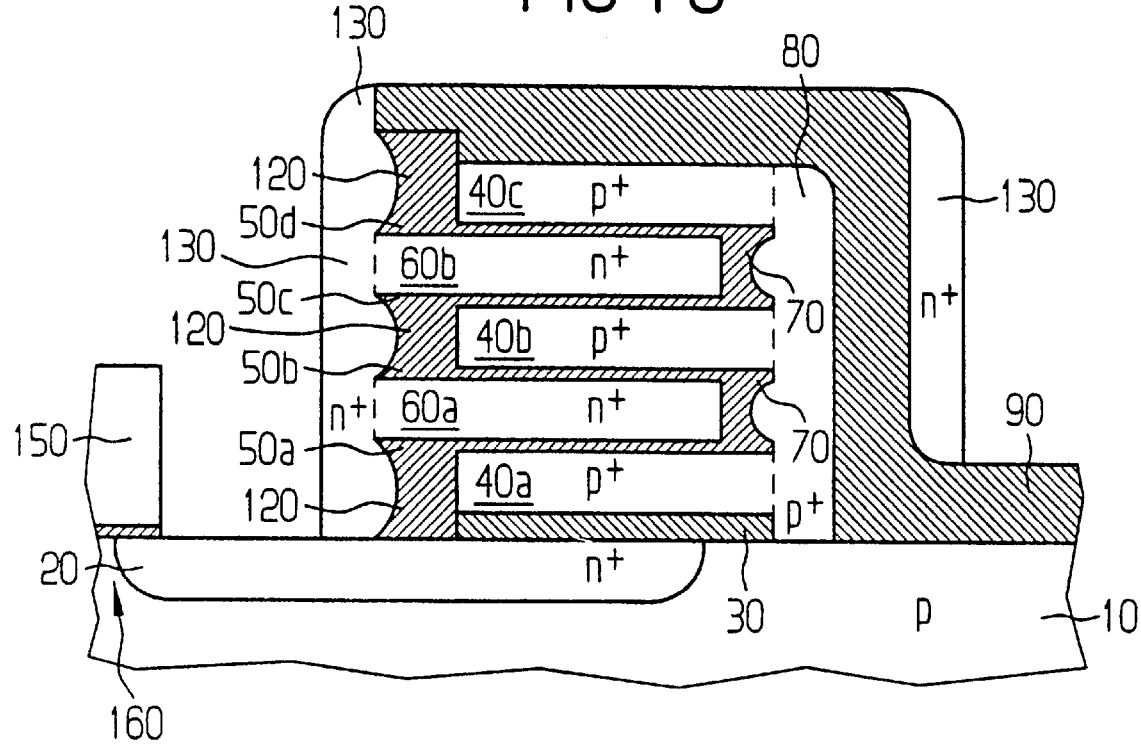

Referring now to the figures of the drawing in detail and first, particularly, to the sequential views in FIGS. 1A to 1O thereof, there are illustrated the essential method steps of a first embodiment of the method for fabricating the stacked capacitor according to the invention. The views are saggital sections through the capacitor, which are chosen in such a way that the capacitor connections are situated to the left and to the right of the stack.

FIGS. 1A and 1B show a p-type silicon semiconductor substrate 10, an $n^+$-type well 20 (drain region of a selection transistor) introduced into the substrate (e.g. by diffusion), an ONO insulation layer 30, oxide insulation layers 50a–50d, first conductive $p^+$-type polysilicon layers 40a, 40b, 40c, and second conductive $n^+$-type polysilicon layers 60a, 60b.

The designation semiconductor substrate 10 is in this case intended to be understood generally and can mean not only a solid substrate but also a corresponding well provided therein.

As shown in FIGS. 1A and 1B, first of all the ONO insulation layer 30 and, on top of this, alternately the $p^+$-type polysilicon layers 40a to 40c and $n^+$-type polysilicon layers 60a, 60b with the oxide layers 50a, 50b, 50c, 50d situated in between are deposited by means of known technology (e.g. CVD deposition) in the form of a stack.

This is followed, in accordance with FIG. 1C, by the formation of a first photomask 65 for the definition of the right-hand side of the stack comprising the polysilicon layers and the oxide layers. After the patterning of the photomask 65, the right-hand side of the stack in FIG. 1C is etched, the nitride of the ONO layer 30 acting as an etching stop. In this case, the right-hand side of the stack lies above the p-type semiconductor substrate 10.

As shown in FIG. 1D, the $n^+$-doped polysilicon of the layers 60a, 60b is then etched selectively using KOH or chlorine in order to effect respective undercutting of the $n^+$-type polysilicon layers 60a, 60b with respect to the neighboring $p^+$-type polysilicon layers 40a, 40b, 40c.

Subsequently, as shown in FIG. 1E, an oxide layer 70 is deposited conformably, that is to say with corresponding edge coverage. The layer thickness of the oxide layer is at least half the layer thickness of an $n^+$-type polysilicon layer, with the result that the place where the $n^+$-type layers have been etched into is completely filled with oxide.

The oxide layer 70 is then isotropically etched in order to form insulation bridges 70 on the right-hand side of the stack in FIG. 1F. These insulation bridges have the effect of providing continuous insulation of the second conductive $n^+$-type polysilicon layers 60a, 60b toward the right-hand side. The ONO layer 30 is subsequently removed at the right-hand side of the stack in order to uncover the surface of the semiconductor substrate 10.

Afterwards, as illustrated in FIG. 1G, a $p^+$-type polysilicon layer 80 is deposited over the entire area and anisotropically etched in order to form, in a self-aligned manner, a right-hand sidewall spacer 80 in accordance with FIG. 1H. The spacer connects the first conductive $p^+$-type polysilicon layers 40a, 40b, 40c to the surface of the semiconductor substrate 10 in order, in this way, to provide a first capacitor connection, which is usually at ground potential.

With reference to FIG. 1I, the stack produced in this way with the sidewall spacer 80 has deposited on it first of all a nitride layer 90 and then a second photoresist layer 100, which is patterned photolithographically. An etching process is then carried out, in which first the nitride and then, after the removal of the second photoresist layer 100, the $p^+$-type polysilicon, the oxide and the $n^+$-type polysilicon are etched on the left-hand side of the stack down to the ONO layer 30. This process defines the left-hand side of the stack. Once more, the nitride layer of the ONO layer 30 serves as an etching stop.

Subsequently, as shown in FIG. 1J, renewed etching using KOH or chlorine is effected in order to produce an undercut of the $n^+$-type polysilicon layers 60a, 60b with respect to the neighboring $p^+$-type polysilicon layers 40a, 40b, 40c.

Afterwards, as shown in FIG. 1K, a nitride layer 110 is conformally deposited over the resulting structure and etched anisotropically in order to form etching stop layers or bridges 110 on the left-hand side of the undercut $n^+$-type polysilicon layers 60a, 60b.

Afterwards, as shown in FIG. 1L, the $p^+$-type polysilicon of the layers 40a, 40b, 40c is etched in order to produce an undercut of the $p^+$-type polysilicon layers 40a, 40b, 40c with respect to the neighboring $n^+$type polysilicon layers 60a, 60b. In this case, the nitride bridges 110 prevent an etching attack on the $n^+$-type polysilicon layers 60a, 60b.

Nitride etching is subsequently effected in order to remove the nitride of the ONO layer 30 and the nitride bridges 110, whereby the nitride layer 90 is only thinned. Oxide etching is then effected, and this leads to the structure shown in FIG. 1M. The ONO layer 30 is thereby removed at the left-hand side of the stack in order to uncover the surface of the $n^+$-type well 20.

With reference to FIG. 1N an oxide layer 120 is then deposited conformally, that is to say with corresponding edge coverage.

In a similar manner to the oxide layer 70 in FIG. 1E, the oxide layer 120 is also etched isotropically in order to form insulation bridges 120 on the left-hand side of the stack in FIG. 1N. These insulation bridges have the effect of providing continuous insulation of the first conductive $p^+$-type polysilicon layers 40a, 40b, 40c toward the left-hand side.

Afterwards, as illustrated in FIG. 1O, an $n^+$-type polysilicon layer 130 is deposited over the entire area and etched in a self-aligning manner and anisotropically in order to form a left-hand sidewall spacer 130 in accordance with FIG. 1O. The spacer 130 connects the second conductive n+-type polysilicon layers 60a, 60b to the surface of the n+-type well 20 in order, in this way, to produce a second capacitor terminal. The second capacitor terminal can be connected to a supply potential via the gate structure 150.

The first embodiment of the method for fabricating the trench capacitor according to the invention is thus essentially complete.

Figure 2A:
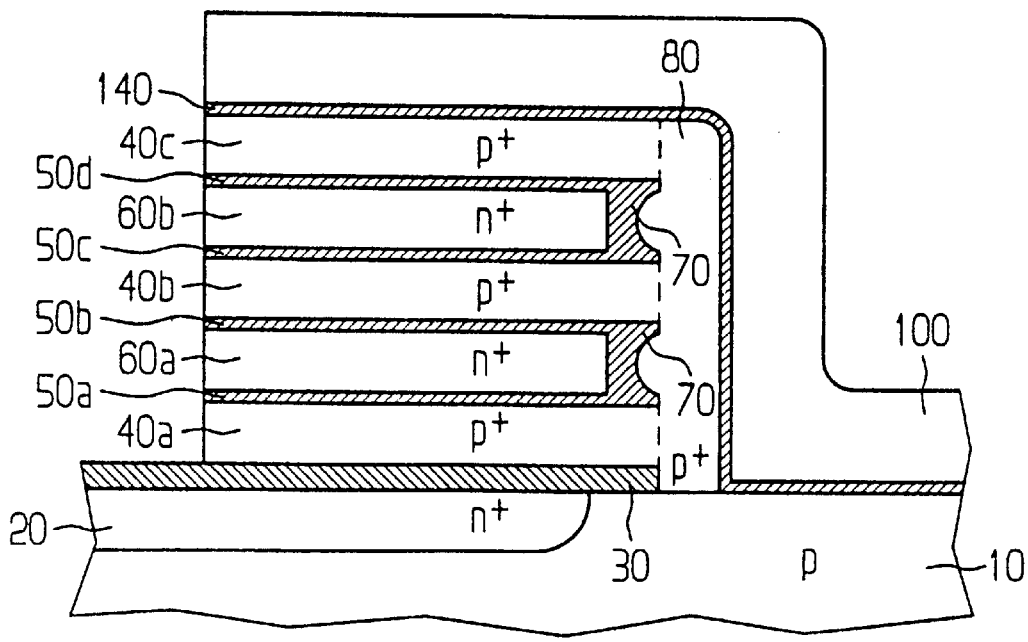
Figure 2B:
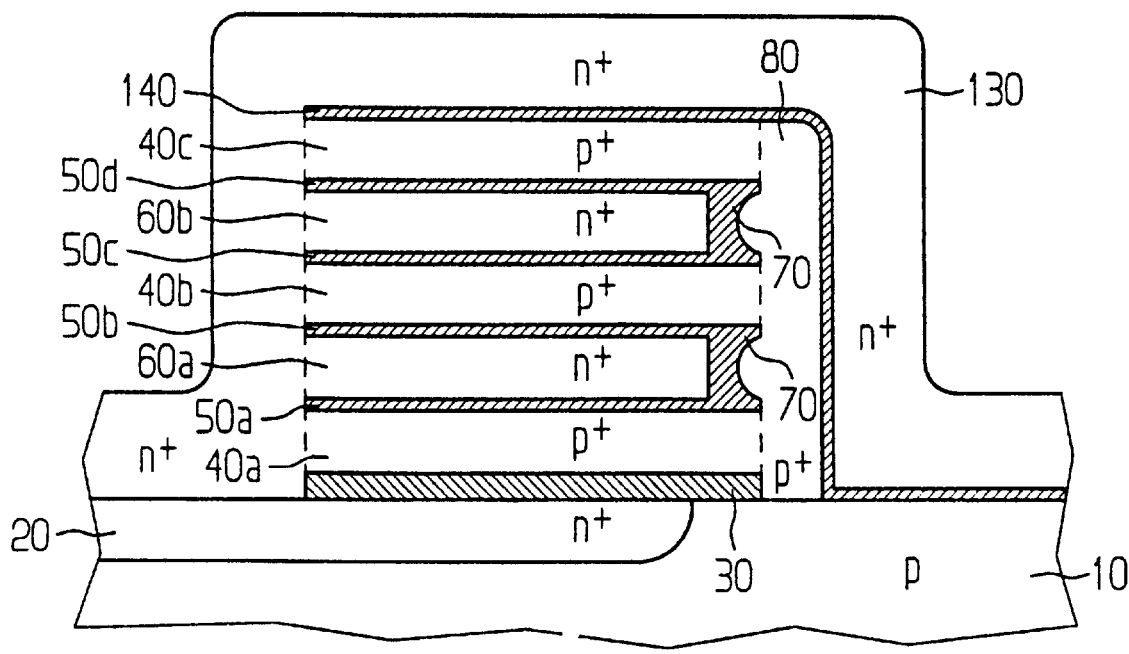

FIGS. 2A–C show the essential method steps of a second embodiment of the method for fabricating the trench capacitor according to the invention following on from the stage of FIG. 1H of the first embodiment, in particular in the form of saggital sections through the capacitor, which are chosen in such a way that the capacitor connections are situated to the left and right of the stack.

In FIGS. 2A–C, in addition to the reference symbols already introduced, 140 designates a further oxide layer. In accordance with FIG. 2A, then, in the second embodiment the further oxide layer 140 is applied rather than a nitride layer as in the case of FIG. 1I of the first embodiment.

The stack is therefore covered by an oxide instead of by a nitride. The left-hand side of the stack is patterned using a second photoresist mask 100, the nitride of the ONO layer 30 acting as an etching stop.

After the removal of the ONO layer 30, an n+-doped polysilicon layer 130 is deposited (FIG. 2B). This layer is etched back anisotropically to produce a spacer made of polysilicon on the left-hand side of the stack, which spacer connects the capacitor to the drain region 20.

Matters are complicated to an extent in this second embodiment by the fact that the insulation of the first conductive layers 40a, 40b, 40c toward the left-hand side is realized by the diode structure formed with the second spacer 130, in other words part of the insulation between the layers comprises a reverse-biased polysilicon diode. This causes certain limitations during the driving of the stacked capacitor during operation.

It will be understood that, although the present invention has been described above using preferred exemplary embodiments, it is not restricted to them but rather can be modified in diverse ways.

Instead of the oxide insulation between the layers of the stack, it is possible to use oxide-nitride-oxide insulation, for example, which entails better insulation properties and a higher dielectric constant. It is then necessary to configure the etching processes accordingly in order to ensure reliable etching.

All materials are mentioned only by way of example and can, of course, be replaced by corresponding materials having suitable properties.

Finally, the stacked capacitor according to the invention has diverse possible uses, which are not limited to semiconductor memories.

In this description, the use of the term substrate is not intended to be restricted to a wafer substrate but rather may encompass epitaxial substrates, well substrates, etc.

Although the first spacer which is provided on the first side of the stack and forms the first capacitor connection is preferably connected to the semiconductor substrate and to the first conductive layers, and although the second spacer which is provided on the second side of the stack and forms the second capacitor connection is preferably connected to the well and to the second conductive layers, the invention is not restricted to this, and other separate connection regions instead of the semiconductor substrate and the well may be provided for this purpose.

I claim:

1. A method of fabricating a stacked capacitor, which comprises the following steps:

providing a semiconductor substrate of a first conductivity type and a well of a second conductivity type formed in the substrate;

forming a stack of alternating first conductive layers of the first conductivity type and second conductive layers of the second conductivity type, with respective insulation layers interposed therebetween, on the semiconductor substrate;

selectively etching the second conductive layers at a first edge region of the stack and undercutting the second conductive layers with respect to the first conductive layers to form undercuts;

forming insulation bridges at the undercuts to provide continuous insulation of the second conductive layers towards the first edge region;

forming a first spacer of a conductive material at the first edge region of the stack, and connecting the first spacer to the semiconductor substrate and to the first conductive layers;

selectively etching the second conductive layers at a second edge region of the stack and undercutting the second conductive layers with respect to the first conductive layers to form undercuts;

forming an etching stop layer at the undercuts;

etching the first conductive layers at the second edge region of the stack and undercutting the first conductive layers with respect to the second conductive layers to form second undercuts;

removing the etching stop layer;

forming insulation bridges at the second undercuts for providing continuous insulation of the first conductive layers towards the second edge region; and forming a second spacer of a conductive material at the second edge region of the stack, and connecting the second spacer to the well and to the second conductive layers.

2. The method according to claim 1, wherein the first conductive layers of the first conductivity type are p+-doped polysilicon layers and the second conductive layers of the second conductivity type are n+-doped polysilicon layers.

3. The method according to in claim 2, wherein the selective etching steps comprise etching with an etchant selected from the group consisting of KOH and chlorine, and thereby only etching the n+-doped polysilicon layers.

4. The method according to claim 1, wherein the method is limited to two photolithography steps, including a first step for forming the first edge region of the stack and a second step forming the second edge region of the stack.

5. The method according to claim 1, wherein the step of forming the first spacer comprises depositing polysilicon of the first conductivity type and subsequent self-aligned anisotropic etching.

6. The method according to claim 1, wherein the step of forming the second spacer comprises depositing polysilicon of the second conductivity type and subsequent anisotropic etching.

7. The method according to claim 1, wherein the semiconductor substrate is a Si substrate, and wherein the insulation layers and the insulation bridges are formed from one of silicon dioxide and silicon dioxide/silicon nitride/silicon dioxide.

8. A method of fabricating a stacked capacitor, which comprises the following steps:

providing a semiconductor substrate of a first conductivity type and a well of a second conductivity type formed in the substrate;

forming a stack of alternating first conductive layers of the first conductivity type and second conductive layers of the second conductivity type, with respective insulation layers interposed therebetween, on the semiconductor substrate;

selectively etching the second conductive layers at a first edge region of the stack and undercutting the second conductive layers with respect to the first conductive layers to form undercuts;

forming insulation bridges at the undercuts to provide continuous insulation of the second conductive layers towards the first edge region;

forming a first spacer of a conductive material of the first conductivity type at the first edge region of the stack, and connecting the first spacer to the semiconductor substrate and to the first conductive layers; and forming a second spacer of a conductive material of the second conductivity type at a second edge region of the stack, and connecting the second spacer to the well and to the first and second conductive layers.

9. The method according to claim 8, wherein the first conductive layers of the first conductivity type are $p^+$-doped polysilicon layers and the second conductive layers of the second conductivity type are $n^+$-doped polysilicon layers.

10. The method according to in claim 8, wherein the selective etching step comprises etching with an etchant selected from the group consisting of KOH and chlorine, and thereby only etching the $n^+$-doped polysilicon layers.

11. The method according to claim 8, wherein the method is limited to two photolithography steps, including a first step for forming the first edge region of the stack and a second step forming the second edge region of the stack.

12. The method according to claim 8, wherein the step of forming the first spacer comprises depositing polysilicon of the first conductivity type and subsequent self-aligned anisotropic etching.

13. The method according to claim 8, wherein the step of forming the second spacer comprises depositing polysilicon of the second conductivity type and subsequent anisotropic etching.

14. The method according to claim 8, wherein the semiconductor substrate is a Si substrate, and wherein the insulation layers and the insulation bridges are formed from one of silicon dioxide and silicon dioxide/silicon nitride/silicon dioxide.

* * * * *